United States Patent
Suzuki

(10) Patent No.: US 10,128,606 B2
(45) Date of Patent: Nov. 13, 2018

(54) CONNECTOR HAVING A POTTING MATERIAL COVERED BY A PROTECTIVE PLATE WITH HOLES FOR CONTACT TERMINALS AND FOR FILLING OF THE POTTING MATERIAL

(71) Applicant: Yazaki Corporation, Tokyo (JP)

(72) Inventor: Etsurou Suzuki, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/911,998

(22) Filed: Mar. 5, 2018

(65) Prior Publication Data
US 2018/0261952 A1 Sep. 13, 2018

(30) Foreign Application Priority Data
Mar. 10, 2017 (JP) .................................. 2017-046580

(51) Int. Cl.
| H01R 13/52 | (2006.01) |
| H01R 13/50 | (2006.01) |
| H01R 43/00 | (2006.01) |
| H05K 5/06 | (2006.01) |
| H01R 43/24 | (2006.01) |

(52) U.S. Cl.
CPC ......... H01R 13/5216 (2013.01); H01R 13/50 (2013.01); H01R 13/5227 (2013.01); H01R 43/005 (2013.01); H01R 43/24 (2013.01); H05K 5/064 (2013.01); *H01R 13/521* (2013.01)

(58) Field of Classification Search
CPC .... H01R 13/50; H01R 13/52; H01R 13/5202; H01R 13/5205; H01R 13/5213; H01R 13/5216; H01R 13/5227; H01R 13/5219; H01R 13/516; H01R 43/005; H01R 43/24; H05K 5/064
USPC ........................................ 439/271, 276, 367
See application file for complete search history.

(56) References Cited

U.S. PATENT DOCUMENTS

| 6,689,957 B2 * | 2/2004 | Onoda ............... H01R 13/5216 174/151 |
| 6,926,540 B1 * | 8/2005 | Juntwait .............. H01R 12/585 439/276 |
| 8,907,230 B2 * | 12/2014 | Chen .................. H01R 13/5216 174/520 |

(Continued)

FOREIGN PATENT DOCUMENTS

JP 2015-38819 A 2/2015

*Primary Examiner* — Chandrika Prasad
(74) *Attorney, Agent, or Firm* — Kenealy Vaidya LLP

(57) ABSTRACT

In a relay connector, a male terminal is formed in a rod-like shape, inserted into a through hole penetrating a male terminal housing chamber, extends inside a cylinder part, and has a first contact part. A protective plate includes a body part that partitions an internal space defined by the cylinder part and the male terminal housing chamber into a first space portion located on the first contact part side of the male terminal and a second space portion located on the male terminal housing chamber side of the male terminal, a terminal hole that is formed in the body part, and configured to receive the male terminal thereinto, and a filling port that is formed in the body part, and communicably connects the first space portion and the second space portion to each other. The second space portion is filled with a potting filling part.

6 Claims, 7 Drawing Sheets

(56) References Cited

U.S. PATENT DOCUMENTS

| | | | |
|---|---|---|---|
| 9,478,893 B2 | 10/2016 | Endo et al. | |
| 2002/0125651 A1* | 9/2002 | Onoda | H01R 13/5216 |
| | | | 277/630 |
| 2007/0049091 A1* | 3/2007 | Sato | H01R 13/506 |
| | | | 439/276 |
| 2011/0147076 A1* | 6/2011 | Chen | H01R 13/5216 |
| | | | 174/520 |
| 2015/0289357 A1* | 10/2015 | Wakana | H05K 5/006 |
| | | | 174/535 |

* cited by examiner

CONNECTOR HAVING A POTTING MATERIAL COVERED BY A PROTECTIVE PLATE WITH HOLES FOR CONTACT TERMINALS AND FOR FILLING OF THE POTTING MATERIAL

CROSS-REFERENCE TO RELATED APPLICATION(S)

The present application claims priority to and incorporates by reference the entire contents of Japanese Patent Application No. 2017-046580 filed in Japan on Mar. 10, 2017.

BACKGROUND OF THE INVENTION

1. Field of the Invention

The present invention relates to a connector.

2. Description of the Related Art

Conventionally, there has been a case that a terminal of a male connector and a terminal of a female connector are electrically connected with each other thus performing wiring connection. The male connector, for example, includes a cylinder part formed in a cylindrical shape, a closing part that closes the cylinder part, and a terminal that penetrates through the closing part. There may be a case that such a male connector includes, for example, a potting material for preventing liquids or particles from entering the male connector through a space between the closing part and the terminal (see Japanese Patent Application Laid-open No. 2015-38819, for example).

In a conventional male connector, when filling with the potting material, the breakage of bubbles contained in the potting material may cause the potting material to scatter and adhere to the contact surface of the terminal to result in deterioration of electrical connection of a contact surface; and there is much room for improvement in this respect.

SUMMARY OF THE INVENTION

The present invention has been made under such circumstances, and it is an object of the present invention to provide a connector capable of suppressing the deterioration in connectivity of the terminal.

In order to solve the above mentioned problem and achieve the object, a connector according to one aspect of the present invention includes a cylinder part formed in a cylindrical shape; a closing part configured to close the cylinder part; a first terminal formed in a rod-like shape, the first terminal being configured to be inserted into a through hole penetrating the closing part and to extend inside the cylinder part, and having a contact part brought electrically into contact with a connection object at an end of the first terminal in an extending direction on an extending side inside the cylinder part; a protective plate including a body part configured to partition an internal space that is defined by the cylinder part and the closing part into a first space portion located on the contact part side of the first terminal and a second space portion located on the closing part side of the first terminal, a terminal hole formed in the body part, the terminal hole being configured to receive the first terminal thereinto, and a filling port formed in the body part, the filling port being configured to communicably connect the first space portion and the second space portion to each other; and a filler with which the second space portion is filled.

According to another aspect of the present invention, in the connector, it is preferable that the contact part of the first terminal is located in the internal space, and the contact part is electrically brought into contact with a second terminal of a counterpart connector in the internal space, the second terminal being the connection object.

According to still another aspect of the present invention, in the connector, it is preferable that the contact part of the first terminal is located on an outside of the internal space, and the contact part is electrically brought into contact with a circuit body of a board on the outside of the internal space, the circuit body being the connection object.

According to still another aspect of the present invention, in the connector, it is preferable that the filling port is an opening for filling the second space portion with the filler.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

A mode for carrying out the present invention (hereinafter, referred to as "embodiment") is specifically explained with reference to drawings. The present invention is not limited to the contents described in the following embodiment. Furthermore, constitutional features in the following embodiment include a part that is easily conceivable by those skilled in the art, or parts substantially equal to each other. Constitutional examples described below can be optionally combined with each other. In addition, various abbreviations, substitutions, or modifications of the constitutions described below can be made without departing from the gist of the present invention.

Embodiment

Figure 1:
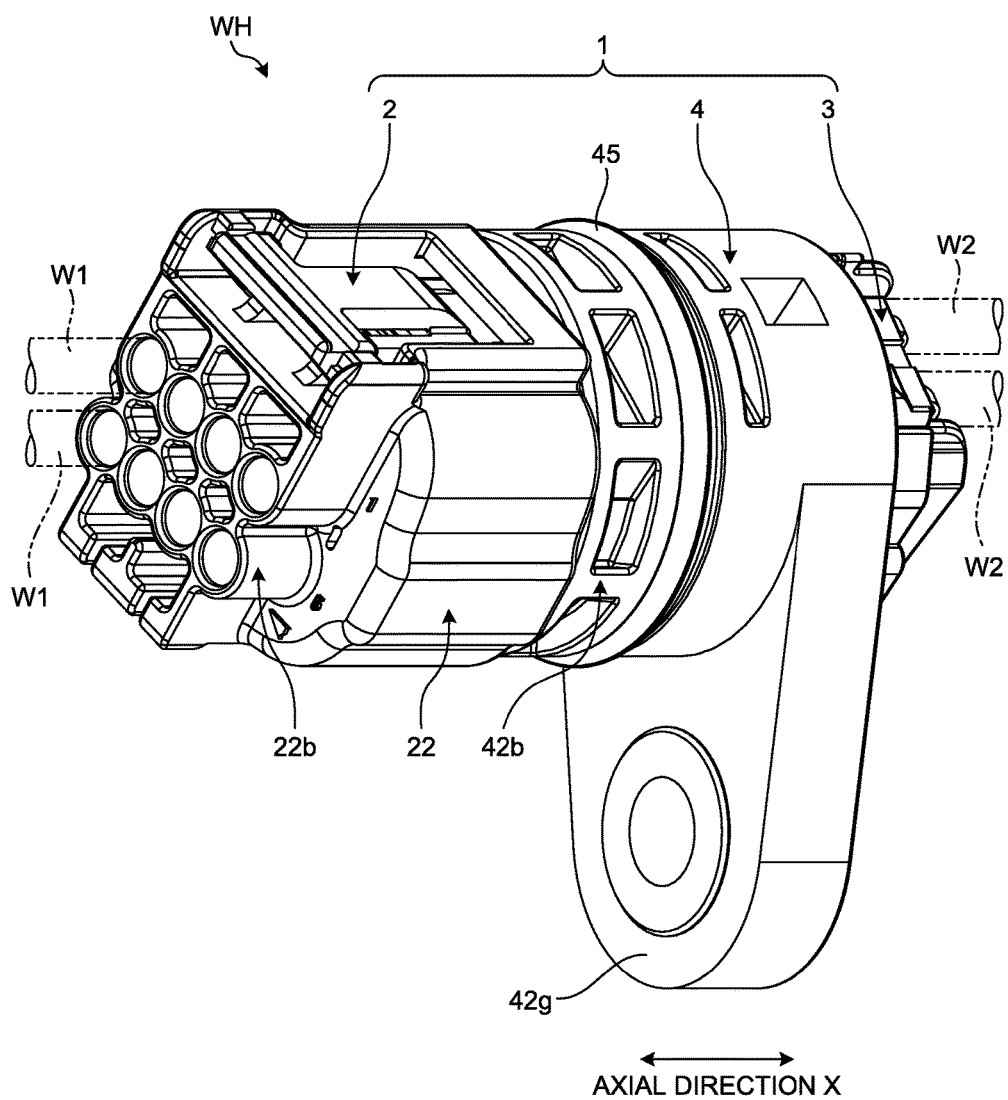
FIG. 1 is a perspective view illustrating a constitutional example of a connector mechanism according to an embodiment.
Figure 2:
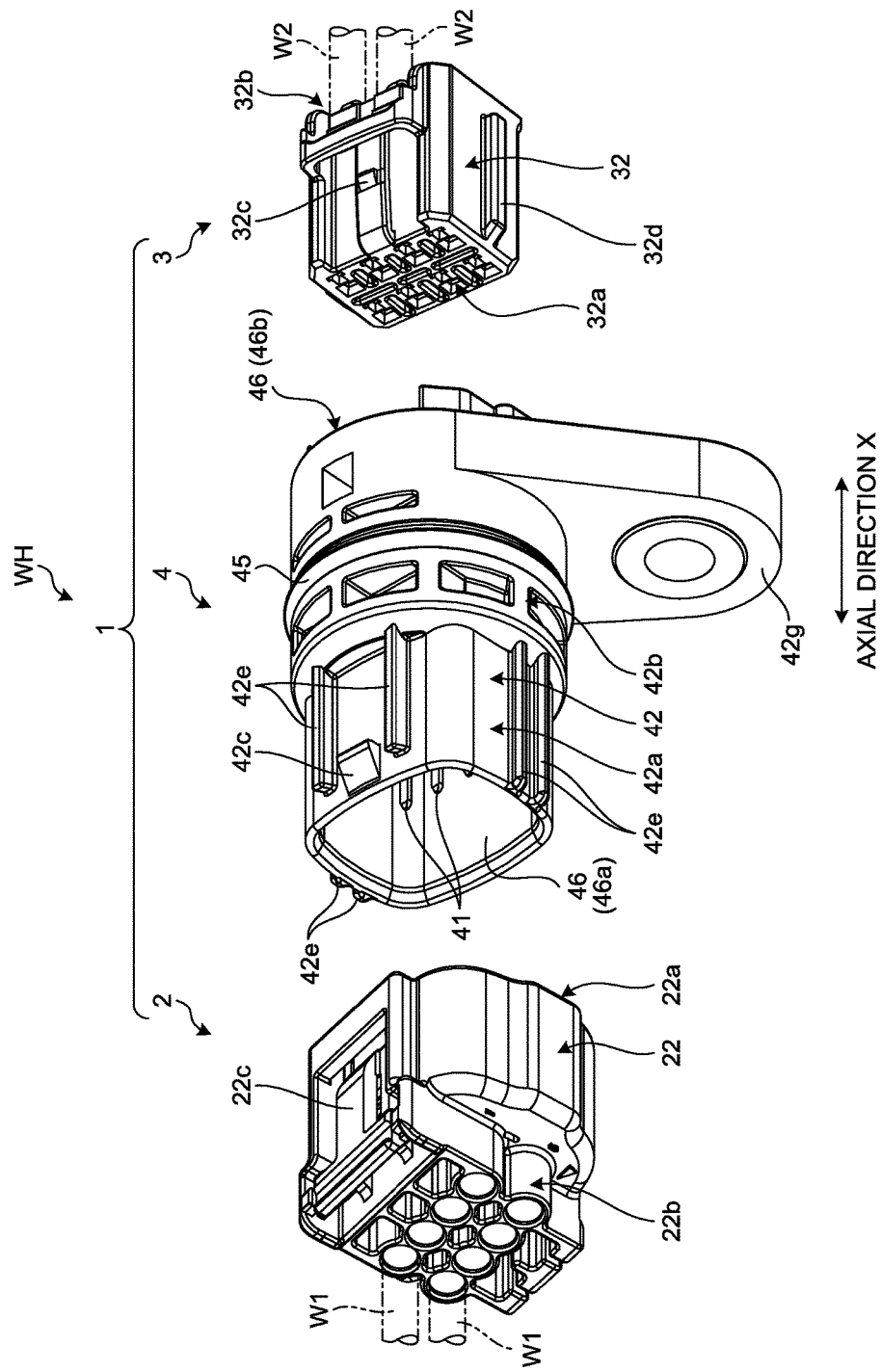
FIG. 2 is an exploded perspective view illustrating the constitutional example of the connector mechanism according to the embodiment.

A connector mechanism 1 according to the embodiment is explained. The connector mechanism 1 is, for example, applicable to a wire harness WH or the like, the wire harness WH being used for an automotive or the like. Here, the connector mechanism 1 is, for example, an automatic (AT) bushing connector mechanism, the connector mechanism 1 being used as a connection part when supplying electric power or the like to an automatic transmission. The connector mechanism 1 is, as illustrated in FIG. 1 and FIG. 2, provided with a first female connector 2 that is connected with a power source via an electric wire W1, a second female connector 3 that is connected with the automatic transmission via an electric wire W2, and a relay connector 4 that relays the first female connector 2 and the second female connector 3. Furthermore, the connector mechanism 1 electrically connects the first female connector 2 and the second female connector 3 to each other via the relay connector 4 thus achieving the stabilization of contact between terminals. Here, each of the electric wires W1 and W2 is, for example, constituted of a conductor part (core wire) formed by twisting a plurality of conductive metallic wires, and an insulative coating part that covers the outside of the conductor part. In the connector mechanism 1, the relay connector 4 is fitted in an opening 51 of an AT casing 5 mentioned below, the AT casing 5 being filled with AT oil, the first female connector 2 is arranged outside the AT casing 5 (in an engine room), and the second female connector 3 is arranged in the inside of the AT casing 5. In the connector mechanism 1, the first female connector 2 and the second female connector 3 are fitted in the relay connector 4 interposed therebetween thus forming a mutual electrical connection part. Due to such constitution, the connector mechanism 1 according to the embodiment electrically connects a power source and the automatic transmission via the first female connector 2, the relay connector 4, and the second female connector 3 thus supplying electric power from the power source to the automatic transmission.

In the following explanation, an axial direction X is typically a direction along the direction in which the relay connector 4 and the first female connector 2 (the second female connector 3) are fitted in each other. The relay connector 4 and the first female connector 2 (the second female connector 3) are arranged so as to face each other in an opposed manner in the axial direction X, and fitted in each other. Each direction used in the following explanation indicates a direction in a state that the parts are assembled with one another, unless otherwise noted.

Figure 3:
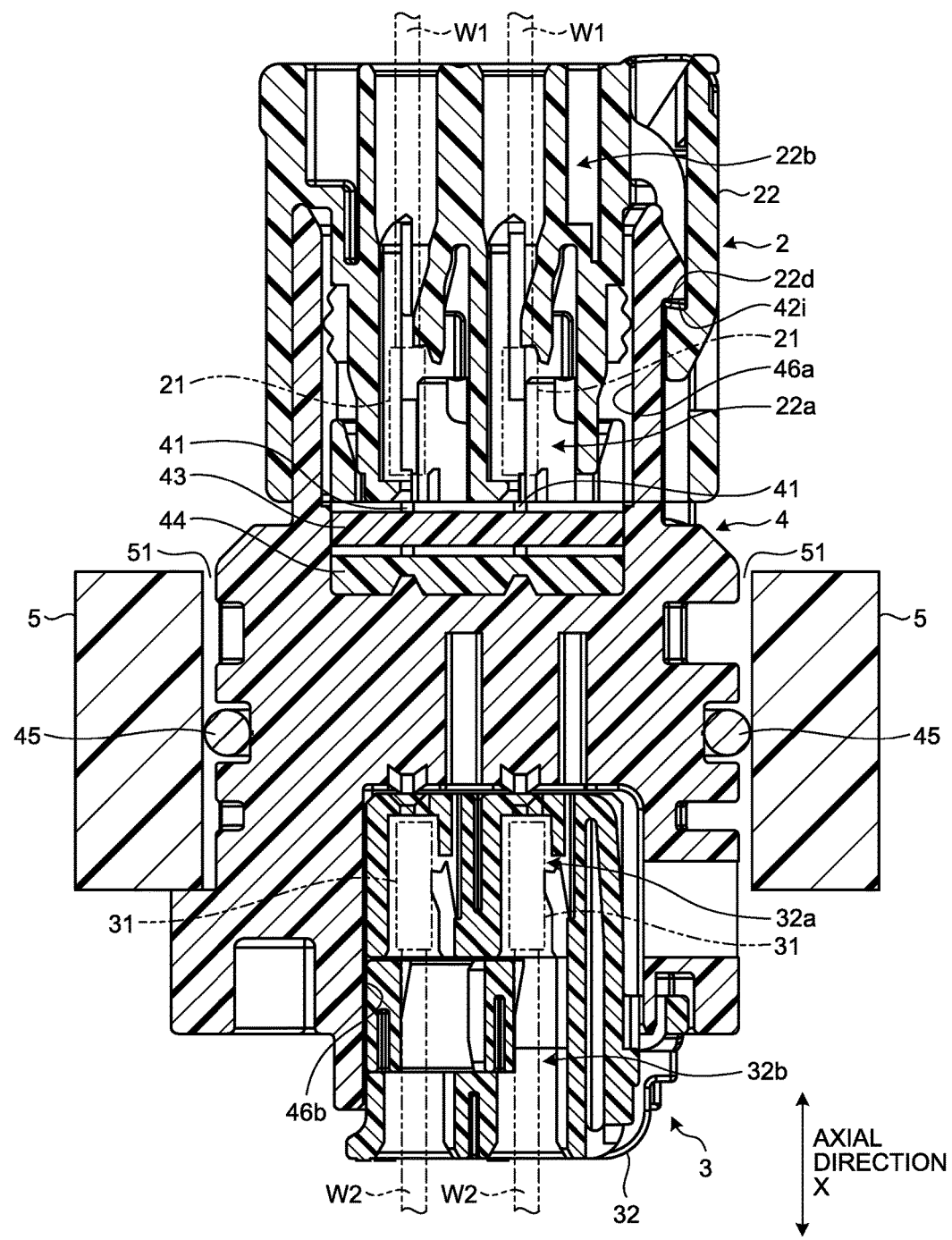
FIG. 3 is a sectional view illustrating the constitutional example of the connector mechanism according to the embodiment.

The first female connector 2 is a female-type connector, the first female connector 2 being fitted in an internal space 46a formed on one side of the relay connector 4, the internal space 46a being described below. The first female connector 2, as illustrated in FIG. 3, includes a plurality of first female terminals 21, and a first female housing 22. Each of the first female terminals 21 is a metal fitting formed of a conductive metallic material. Each of the first female terminals 21 is formed in a cylindrical shape along the axial direction X, and arranged in a first female terminal housing chamber 22a (cavity) of the first female housing 22 along the axial direction X. Each of the first female terminals 21 is connected with the end of the electric wire W1 at one end thereof. In the first female connector 2, the first female terminal housing chamber 22a is fitted in the internal space 46a formed on one side of the relay connector 4, and each of the first female terminals 21 is electrically connected with one side of a male terminal (bus bar) 41 of the relay connector 4.

The first female housing 22 is a female-type connector housing in which each of the first female terminals 21 is arranged, the first female housing 22 being formed of an insulative synthetic resin material or the like. The first female housing 22 is provided with the first female terminal housing chamber 22a (cavity) that houses therein each of the first female terminals 21, the first electric-wire housing chamber 22b that communicates with the first female terminal housing chamber 22a and houses therein the end of the electric wire W1 connected with each of the first female terminals 21, a pawl reception part 22c that is formed in a projecting shape and engaged with a relay housing 42, and a locking arm 22d engaged with a fixing beak 42i of the relay housing 42 described below.

The second female connector 3 is a female-type connector and is fitted in an internal space 46b formed on the other side of the relay connector 4, the internal space 46b being described below. The second female connector 3 includes a plurality of second female terminals 31, and a second female housing 32. Each of the second female terminals 31 is a metal fitting formed of a conductive metallic material. Each of the second female terminals 31 is formed in a cylindrical shape along the axial direction X, and arranged in a second female terminal housing chamber 32a (cavity) of the second female housing 32 along the axial direction X. Each of the second female terminals 31 is connected with the end of the electric wire W2 at one end thereof. In the second female connector 3, the second female terminal housing chamber 32a is fitted in the internal space 46b formed on the other side of the relay connector 4, and each of the second female terminals 31 is electrically connected with the other side of a male terminal 41 of the relay connector 4.

The second female housings 32 is a female-type connector housing in which each of the second female terminals 31 is arranged, and is formed of an insulative synthetic resin material or the like. The second female housing 32 is provided with the second female terminal housing chamber 32a that houses therein each of the second female terminals 31, a second electric-wire housing chamber 32b that communicates with the second female terminal housing chamber 32a and houses therein the end of the electric wire W2 connected with each of the second female terminals 31, a pawl part 32c that is formed in a projecting shape and engaged with a relay housing 42, and a locking arm (not illustrated in the drawings) engaged with a fixing beak 42j of the relay housing 42 described below.

Figure 4:
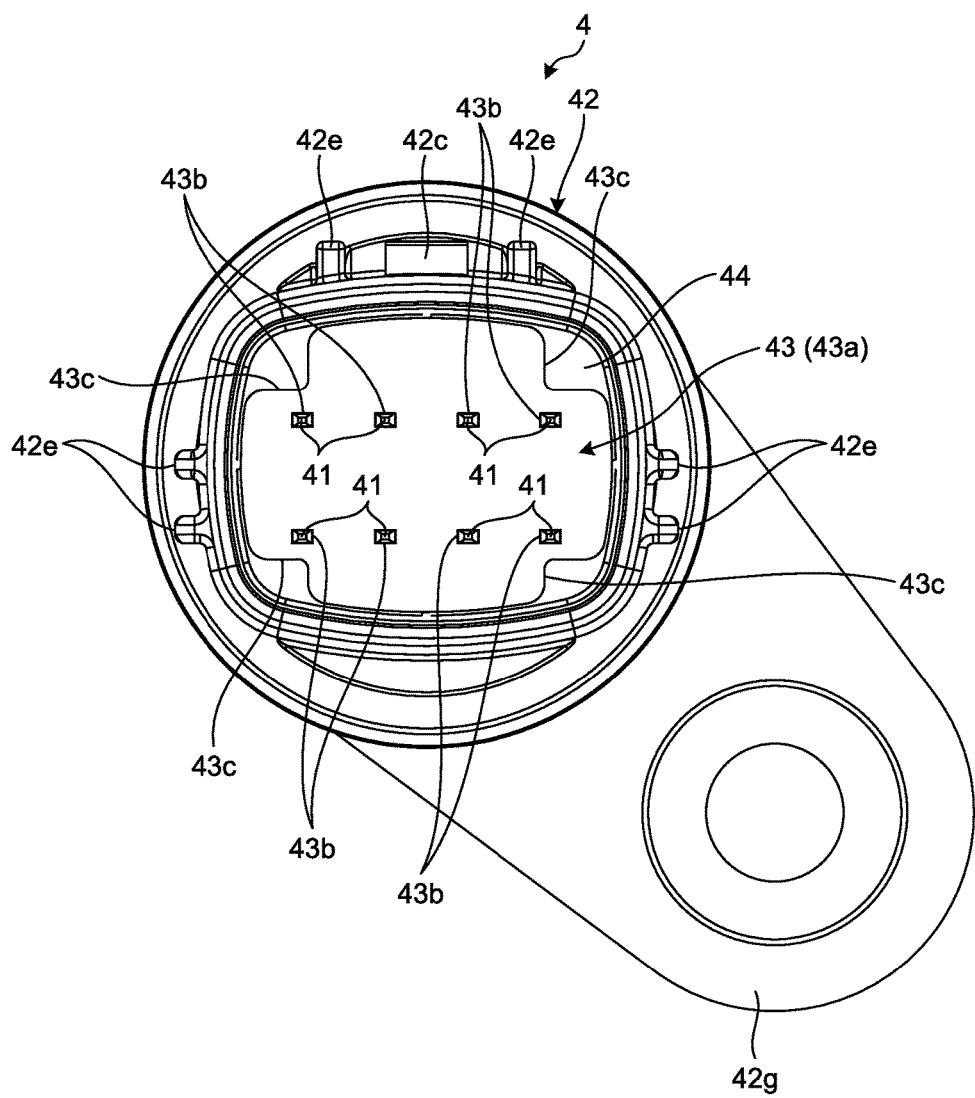
FIG. 4 is a plan view illustrating a constitutional example of a male connector according to the embodiment.
Figure 5:
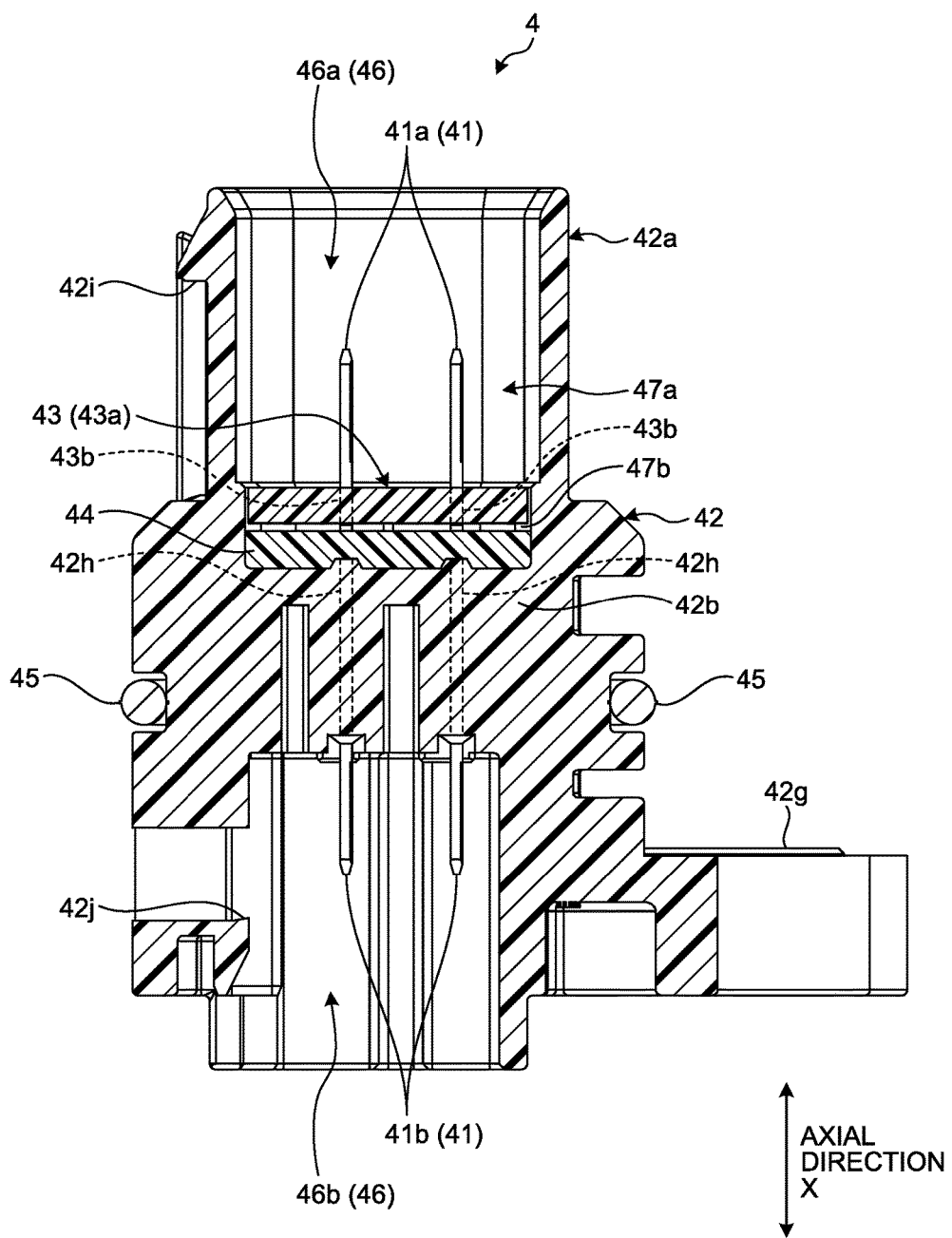
FIG. 5 is a sectional view illustrating the constitutional example of the male connector according to the embodiment.

The relay connector 4 is a male-type connector that relays electrical connection between the first female connector 2 and the second female connector 3. The relay connector 4, as illustrated in FIG. 4 and FIG. 5, includes the plurality of male terminals 41 as terminals, the relay housing 42, a protective plate 43, and a potting filling part 44 as a filler. Each of the male terminals 41 is a metal fitting formed of a conductive metallic material. Each of the male terminals 41 is formed in a rod-like shape along the axial direction X, and arranged in a male terminal housing chamber 42b (cavity) of the relay housing 42 along the axial direction X. The respective male terminals 41 are, for example, inserted into a plurality of through holes 42h each of which penetrates the male terminal housing chamber 42b along the axial direction X, the male terminal 41 being configured to extend inside a cylinder part 42a of the relay housing 42. Each of the male terminals 41 is fixed to the male terminal housing chamber 42b by press fitting or insert molding. Each of the male terminals 41 includes a first contact part 41a that is arranged on one end of the male terminals 41 in the axial direction X and electrically brought into contact with the first female terminal 21 as a connection object, and a second contact part 41b that is arranged on the other end of the male terminals 41 in the axial direction X and brought into contact with each of the second female terminals 31. In each of the male terminals 41, the first and second contact parts 41a and 41b are located in the inside of the cylinder part 42a of the relay housing 42. That is, in each of the male terminals 41, the first and second contact parts 41a and 41b are located in an internal space 46 of the relay housing 42. Here, the internal space 46 is constituted of the internal space 46a formed on one side of the relay housing 42 and the internal space 46b formed on the other side of the relay housing 42 with the male terminal housing chamber 42b interposed therebetween. That is, the internal space 46a formed on one side of the relay housing 42 is a space portion that is formed on a first female connector 2 side of the relay housing 42 and defined by the cylinder part 42a and the male terminal housing chamber 42b, and the internal space 46b formed on the other side of the relay housing 42 is a space portion that is formed on a second female connector 3 side of the relay housing 42 and defined by the cylinder part 42a and male terminal housing chamber 42b. In each of the male terminals 41, the first contact part 41a of the male terminal 41 is electrically brought into contact with the first female terminal 21 of the first female connector 2 in the internal space 46a formed on one side of the relay housing 42, and the second contact part 41b of the male terminal 41 is electrically brought into contact with the second female terminal 31 of the second female connector 3 in the internal space 46b formed on the other side of the relay housing 42. In the relay connector 4, the first female terminal housing chamber 22a of the first female connector 2 is fitted in the internal space 46a formed on one side of the relay connector 4, and the first contact part 41a of the male terminal 41 and the first female terminal 21 are electrically connected with each other. Furthermore, in the relay connector 4, the second female terminal housing chamber 32a is fitted in the internal space 46b formed on the other side of the relay connector 4, and the second contact part 41b of the male terminal 41 and the second female terminal 31 are electrically connected with each other. Due to such constitution, the relay connector 4 electrically connects the first female connector 2 and the second female connector 3 to each other thus electrically connecting the power source connected with the first female connector 2 via the electric wire W1 and the automatic transmission connected with the second female connector 3 via the electric wire W2 to each other.

The relay housing 42 is a male-type connector housing in which each of the male terminals 41 is arranged, and is formed of an insulative synthetic resin material or the like. The relay housing 42 is provided with the cylinder part 42a formed in a cylindrical shape, the male terminal housing chamber 42b (cavity) as a closing part that closes the cylinder part 42a, a pawl part 42c with which the first female housing 22 is engaged, a pawl reception part (not illustrated in the drawings) with which the second female housing 32 is engaged, the fixing beak 42i engaged with the locking arm 22d of the first female housing 22, the fixing beak 42j engaged with a locking arm (not illustrated in the drawings) of the second female housing 32, a first rail part 42e that is formed in a projecting shape and guides the first female housing 22, a second rail part (not illustrated in the drawings) that is formed in a grooved shape and guides the second female housing 32, an O ring 45 for water-tightly fixing to the opening 51 of the AT casing 5, and a fixing part 42g that is formed in a projecting manner from the peripheral face of the cylinder part 42a and fixes the relay housing 42 to the AT casing 5. The male terminal housing chamber 42b houses therein each of the male terminals 41 and is formed in the approximately center part of the cylinder part 42a in the axial direction X. The male terminal housing chamber 42b has the plurality of through holes 42h each of which penetrates the male terminal housing chamber 42b along the axial direction X. The male terminal housing chamber 42b holds each of the male terminals 41 in a state that each of the male terminals 41 is inserted into the through hole 42h, and the first contact part 41a and the second contact part 41b of each of the male terminals 41 are exposed to both sides of the male terminal housing chamber 42b. That is, the male terminal housing chamber 42b holds each of the male terminals 41 in a state that the first contact part 41a of each of the male terminals 41 is exposed in the internal space 46a formed on one side of the relay connector 4, and the second contact part 41b of each of male terminals 41 is exposed in the internal space 46b formed on the other side of the relay connector 4.

The pawl part 42c engages the first female connector 2 and the relay connector 4. The pawl part 42c is formed in a projecting shape. When the first female terminal housing chamber 22a is fitted in the internal space 46a of the relay connector 4, the pawl part 42c is engaged with the pawl reception part 22c of the first female connector 2, and the fixing beak 42i is engaged with the locking arm 22d of the first female housing 22. The pawl reception part (not illustrated in the drawings) engages the second female connector 3 and the relay connector 4. The pawl reception part is formed in a projecting shape. When the second female terminal housing chamber 32a is fitted in the internal space 46b of the relay connector 4, the pawl reception part is engaged with the pawl part 32c of the second female connector 3, and the fixing beak 42j is engaged with the locking arm (not illustrated in the drawings) of the second female housing 32.

The first rail part 42e guides the first female housing 22 along the axial direction X. The first rail part 42e is linearly formed on the first female housing 22 side peripheral face of the cylinder part 42a along the axial direction X. The first rail part 42e is fitted in a rail part (not illustrated in the drawings) formed in a grooved shape in the inside of the first female housing 22, and guides the first female housing 22 along the axial direction X. The second rail part (not illustrated in the drawings) guides the second female housing 32 along the axial direction X. The second rail part is linearly formed on the second female housing 32 side inner peripheral face of the cylinder part 42a along the axial direction X. The second rail part is fitted in a rail part 32d formed in a projecting shape on the outside of the second female housing 32, and guides the second female housing 32 along the axial direction X.

Figure 6:
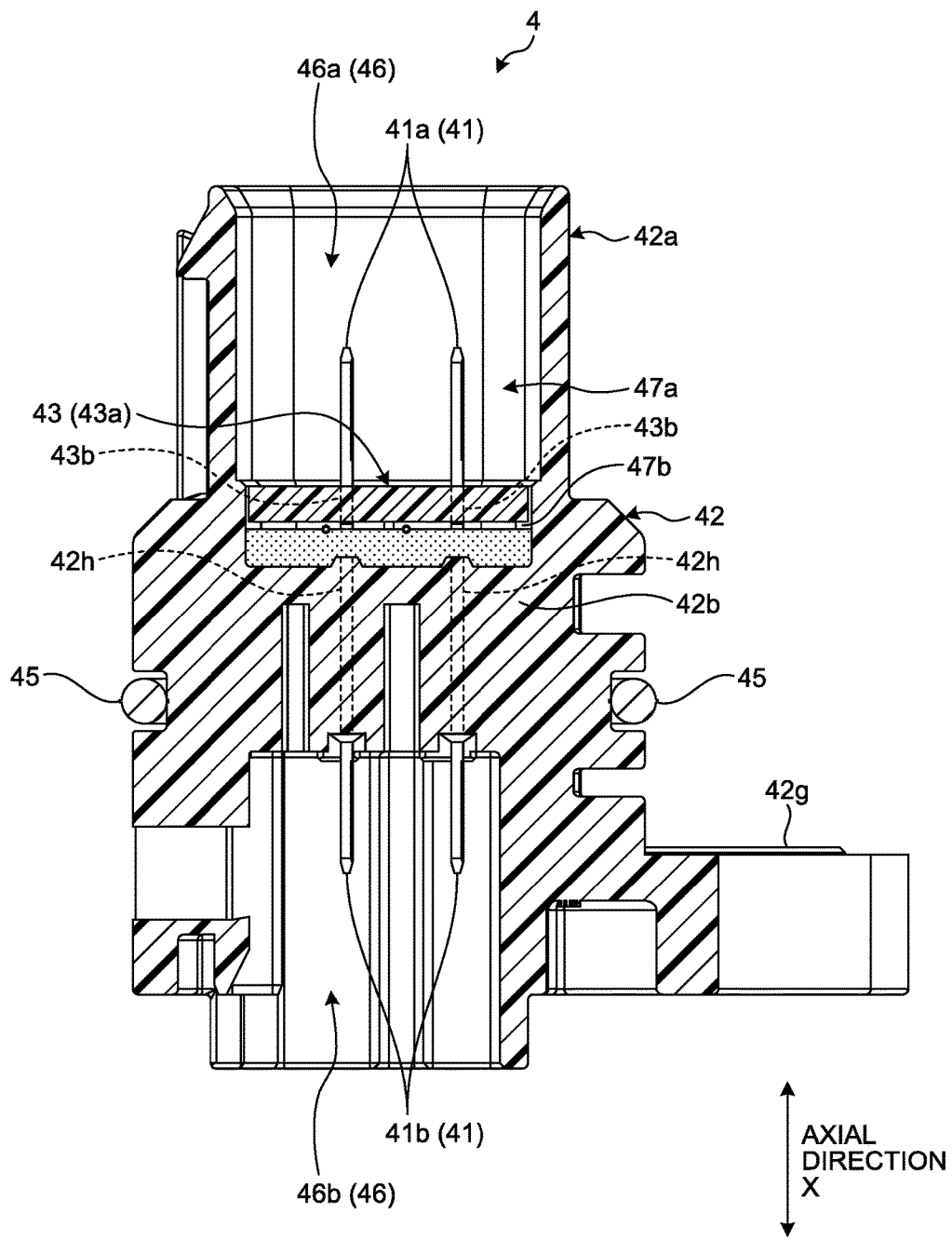
FIG. 6 is a sectional view illustrating a functional example of the male connector according to the embodiment.

The protective plate 43 is a member that suppresses, for example, the adherence of a potting material composed of an epoxy resin material or the like to the first contact part 41a. Here, the potting material suppresses the entering of the AT oil in the AT casing 5 into the internal space 46a located on the first contact part 41a side of the relay housing 42. That is, the potting material prevents the AT oil from entering the inside of the cylinder part 42a in the relay housing 42 through the clearance between the through holes 42h and each of the male terminals 41 in the male terminal housing chamber 42b. The protective plate 43 is provided with a body part 43a, a plurality of terminal holes 43b, and a plurality of filling ports 43c. The body part 43a is formed in a plate-like shape, and arranged in the inside of the cylinder part 42a. The body part 43a is located between the first contact part 41a and the male terminal housing chamber 42b, and adhesively fixed, for example, to a predetermined position in the inside of the cylinder part 42a by an adhesive or the like. The body part 43a is a plate member that separates the first contact part 41a side from the male terminal housing chamber 42b side in the inside of the cylinder part 42a. That is, the body part 43a partitions the internal space 46a into a first space portion 47a located on the first contact part 41a side and a second space portion 47b located on the male terminal housing chamber 42b side, the internal space 46a being defined by the cylinder part 42a and the male terminal housing chamber 42b, and located on the first female connector 2 side of the relay housing 42. Each of the terminal holes 43b is a hole formed in the body part 43a, the hole being configured to receive each of the male terminals 41 thereinto. Each of the terminal holes 43b is located at a position corresponding to the position of the male terminal 41, and formed substantially with the same size as the outer periphery of the male terminal 41. Due to such constitution, each of the terminal holes 43b is capable of specifying the position of the male terminal 41 in a state that each of the male terminals 41 is inserted into the terminal hole 43b. The filling port 43c is an opening for filling the second space portion 47b with the potting material. The filling port 43c is arranged in the body part 43a, and communicably connects the first space portion 47a and the second space portion 47b to each other. The filling port 43c is, for example, arranged in each of four corners of the body part 43a. The filling port 43c inserts, for example, thereto a nozzle for filling the second space portion 47b located on the male terminal housing chamber 42b side of the internal space 46a with the potting material. As illustrated in FIG. 6, to consider a case where the second space portion 47b is filled with the potting material poured through the filling port 43c, when bubbles contained in the potting material come up to the surface of the potting material and the breakage of the bubbles causes the potting material to scatter, the protective plate 43 blocks the potting material scattered.

As for the potting filling part 44, a liquid potting material solidifies to form the potting filling part 44. The potting filling part 44 is arranged in the second space portion 47b opposite to the first contact part 41a, and formed on one surface of the male terminal housing chamber 42b. The potting filling part 44 prevents the AT oil from entering the inside of the cylinder part 42a in the relay housing 42 through the clearance between the through holes 42h and each of the male terminals 41 in the male terminal housing chamber 42b.

As described heretofore, the relay connector 4 according to the embodiment includes the cylinder part 42a, the male terminal housing chamber 42b, the male terminals 41, the protective plate 43, and the potting filling part 44. Furthermore, in the relay connector 4, each of the male terminals 41 is formed in a rod-like shape, inserted into the through holes 42h penetrating the male terminal housing chamber 42b, extends inside the cylinder part 42a, and has the first contact part 41a that is electrically brought into contact with the first female connector 2 at the end of the male terminal 41 in the extending direction on the extending side inside the cylinder part 42a. The protective plate 43 includes the body part 43a that partitions the internal space 46a defined by the cylinder part 42a and the male terminal housing chamber 42b into the first space portion 47a located on the first contact part 41a side of the male terminals 41, and the second space portion 47b located on the male terminal housing chamber 42b side of the male terminals 41; the terminal hole 43b that is formed in the body part 43a, and configured to receive each of the male terminals 41 thereinto; and the filling port 43c that is formed in the body part 43a, and communicably connects the first space portion 47a and the second space portion 47b to each other. The second space portion 47b is filled with the potting filling part 44.

Due to such constitution, in the relay connector 4, the potting filling part 44 is capable of preventing the AT oil from entering the inside of the cylinder part 42a in the relay housing 42 through the clearance between the through hole 42h and each of the male terminals 41 in the male terminal housing chamber 42b. To consider a case where the second space portion 47b is filled with the potting material poured through the filling port 43c, when bubbles contained in the potting material come up to the surface of the potting material and the breakage of the bubbles causes the potting material to disperse, the protective plate 43 is capable of blocking the potting material dispersed. Accordingly, the protective plate 43 is capable of suppressing the adherence of the potting material to the first contact part 41a. Consequently, the relay connector 4 is capable of suppressing the deterioration in connectivity of each of the male terminals 41.

Furthermore, in the relay connector 4, the first contact part 41a of each of the male terminals 41 is located in the internal space 46a, and the first contact part 41a is electrically brought into contact with each of the first female terminals 21 of the first female connector 2 in the internal space 46a. Accordingly, the relay connector 4 is capable of being electrically connected with the first female connector 2 in a state that the first female terminal housing chamber 22a is fitted in the internal space 46a located on one side of the relay connector 4.

Furthermore, in the relay connector 4, the filling port 43c is an opening for filling the second space portion 47b with a potting material to form the potting filling part 44. Due to such constitution, in the relay connector 4, for example, it is possible to insert a nozzle for pouring a potting material into the filling port 43c, and pour the potting material into the second space portion 47b from the nozzle to fill the second space portion 47b with the potting material.

Modifications

Next, the modifications of the embodiment are explained. Although the explanation is made with respect to the example in which the body part 43a of the protective plate 43 is adhesively fixed to the inside of the cylinder part 42a with an adhesive, the present invention is not limited to this example. The body part 43a of the protective plate 43 may be fixed to the inside of the cylinder part 42a by using a lock mechanism, a press-fit mechanism, a leg part formed in the body part 43a, or the like.

Furthermore, the shape of the protective plate 43 is one example, and the present invention is not limited to the example provided that the protective plate 43 has a shape such that the protective plate 43 is capable of suppressing the adherence of the potting material to the first contact part 41a.

Figure 7:
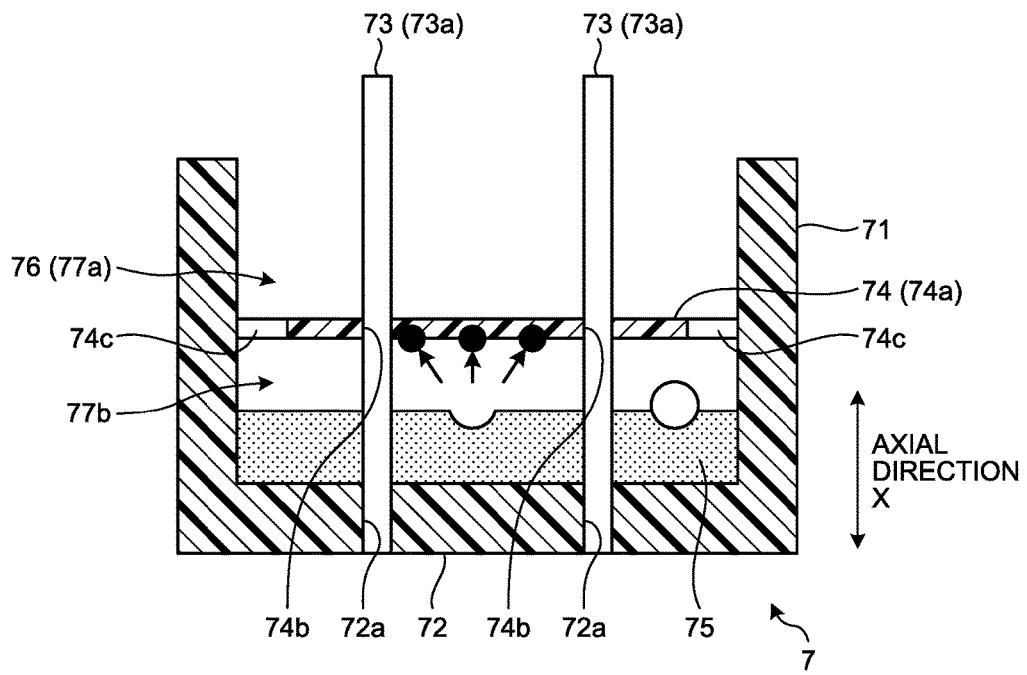
FIG. 7 is a sectional view illustrating a functional example of a protective plate of a connector according to a modification.
Figure 8:
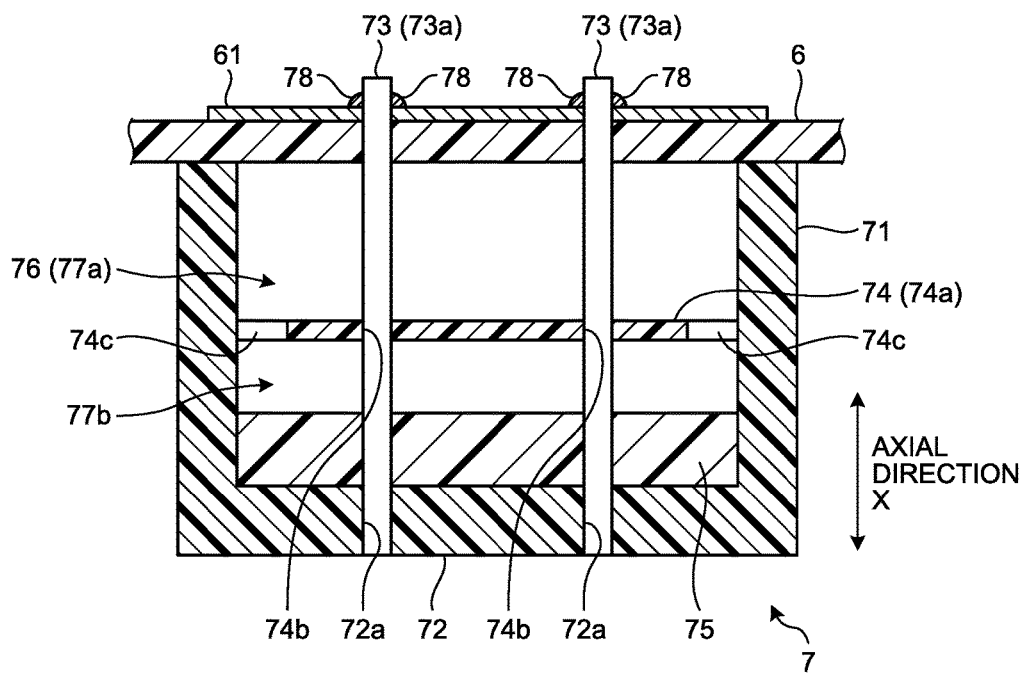
FIG. 8 is a sectional view illustrating the constitutional example of the connecter according to the modification.

Furthermore, the present invention is not limited to the example in which the protective plate 43 is applied to the relay connector 4. For example, the protective plate 43 may be, as illustrated in FIG. 7 and FIG. 8, applied to a board connection connector 7 connected with a circuit body 61 of a board 6. In this case, the board connection connector 7 includes a cylinder part 71 formed in a cylindrical shape, a terminal 73, a closing part 72 that closes the cylinder part 71 and holds the terminal 73, a protective plate 74, and a potting filling part 75. The terminal 73 is formed in a rod-like shape, inserted into a through hole 72a penetrating the closing part 72, extends inside the cylinder part 71, and has a contact part 73a that is electrically brought into contact with the circuit body 61 of the board 6 that is a connection object at the end of the terminal 73 in the extending direction on the extending side inside the cylinder part 71. The protective plate 74 includes a body part 74a that partitions an internal space 76 defined by the cylinder part 71 and the closing part 72 into a first space portion 77a located on the contact part 73a side of the terminal 73, and the second space portion 47b located on the closing part 72 side of the terminal 73; a terminal hole 74b that is formed in the body part 74a, and configured to receive the terminal 73 thereinto; and a filling port 74c that is formed in the body part 74a, and communicably connects the first space portion 77a and a second space portion 77b to each other. The potting filling part 75 is formed in the second space portion 77b. Furthermore, in the board connection connector 7, the contact part 73a of the terminal 73 is located on the outside of the internal space 76, and the contact part 73a is electrically brought into contact with the circuit body 61 of the board 6 that is a connection object, on the outside of the internal space 76. For example, the terminal 73 is inserted into a through hole formed in the board 6, and the contact part 73a is electrically brought into contact with the circuit body 61 by way of a solder 78.

Due to such constitution, in the board connection connector 7, the potting filling part 75 is capable of preventing particles or liquids from entering the inside of the cylinder part 71 of the board connection connector 7 through the clearance between the through hole 72a of the closing part 72 and each of the terminals 73. To consider a case where the second space portion 77b is filled with the potting material poured through the filling port 74c, when bubbles contained in the potting material come up to the surface of the potting material and the breakage of the bubbles causes the potting material to scatter, the protective plate 74 is capable of blocking the potting material scattered (see FIG. 7). Accordingly, the protective plate 74 is capable of suppressing the adherence of the potting material to the contact part 73a. Consequently, the board connection connector 7 is capable of suppressing the deterioration in connectivity of each of the terminals 73.

The connector according to the embodiment includes the terminal inserted into the through hole penetrating the closing part that closes the cylinder part, the protective plate that partitions the internal space defined by the cylinder part and the closing part into the first space portion located on the contact part side of the terminal and the second space portion located on the closing part side of the terminal, and the filler with which the second space portion is filled. Due to such constitution, the protective plate is, for example, capable of suppressing, when the second space portion is filled with the liquid filler, the adherence of the filler scattered by the breakage of the bubbles contained in the filler, to the contact part of the terminal. As a result, it is possible for the connector to suppress the deterioration in connectivity of the terminal.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A connector comprising:
a cylinder part formed in a cylindrical shape;
a closing part configured to close the cylinder part;
a first terminal formed in a rod-like shape, the first terminal being configured to be inserted into a through hole penetrating the closing part and to extend inside the cylinder part, and having a contact part brought electrically into contact with a connection object at an end of the first terminal in an extending direction on an extending side inside the cylinder part;
a protective plate including a body part configured to partition an internal space that is defined by the cylinder part and the closing part into a first space portion located on the contact part side of the first terminal and a second space portion located on the closing part side of the first terminal, a terminal hole formed in the body part, the terminal hole being configured to receive the first terminal thereinto, and a filling port formed in the body part, the filling port being configured to communicably connect the first space portion and the second space portion to each other; and
a filler with which the second space portion is filled.

2. The connector according to claim 1, wherein
the contact part of the first terminal is located in the internal space, and the contact part is electrically brought into contact with a second terminal of a counterpart connector in the internal space, the second terminal being the connection object.

3. The connector according to claim 1, wherein
the contact part of the first terminal is located on an outside of the internal space, and the contact part is electrically brought into contact with a circuit body of a board on the outside of the internal space, the circuit body being the connection object.

4. The connector according to claim 1, wherein
the filling port is an opening for filling the second space portion with the filler.

5. The connector according to claim 2, wherein
the filling port is an opening for filling the second space portion with the filler.

6. The connector according to claim 3, wherein
the filling port is an opening for filling the second space portion with the filler.

* * * * *